(12) United States Patent
Talukdar et al.

(10) Patent No.: US 11,442,110 B2
(45) Date of Patent: Sep. 13, 2022

(54) METHOD AND SYSTEM FOR DETECTING OPERATING STATUS OF BATTERY

(71) Applicant: Samsung Electronics Co., Ltd., Suwon-si (KR)

(72) Inventors: Atanu Talukdar, Bangalore (IN); Anshul Kaushik, Bangalore (IN); Arunava Naha, Bangalore (IN); Shashishekara Parampalli Adiga, Bangalore (IN)

(73) Assignee: Samsung Electronics Co., Ltd., Suwon-si (KR)

( * ) Notice: Subject to any disclaimer, the term of this patent is extended or adjusted under 35 U.S.C. 154(b) by 3 days.

(21) Appl. No.: 17/165,100

(22) Filed: Feb. 2, 2021

(65) Prior Publication Data
US 2021/0239766 A1   Aug. 5, 2021

(30) Foreign Application Priority Data

Feb. 4, 2020   (IN) .............................. 202041004910
Dec. 10, 2020  (KR) ........................ 10-2020-0172624

(51) Int. Cl.
*G01R 31/392* (2019.01)
*G01R 31/389* (2019.01)
(Continued)

(52) U.S. Cl.
CPC ......... *G01R 31/392* (2019.01); *G01R 31/367* (2019.01); *G01R 31/371* (2019.01);
(Continued)

(58) Field of Classification Search
None
See application file for complete search history.

(56) References Cited

U.S. PATENT DOCUMENTS 6,563,318 B2   5/2003   Kawalami et al.
8,334,699 B2   12/2012  Asakura et al.
(Continued)

FOREIGN PATENT DOCUMENTS

CN   106026260 A     10/2016
JP   2006-300694 A   11/2006
(Continued)

OTHER PUBLICATIONS

Ouyang, Minggao, et al., "Internal short circuit detection for battery pack using equivalent parameter and consistency method," *Journal of Power Sources*, 294, 2015 (pp. 272-283).
(Continued)

*Primary Examiner* — Jas A Sanghera
(74) *Attorney, Agent, or Firm* — NSIP Law

(57) ABSTRACT

The present disclosure relates to a method and apparatus for accurately detecting an operating status of a battery in a battery system, where the method includes determining a charging profile of a battery in a battery system, identifying a constant voltage and a corresponding constant current in a charging cycle of the charging profile, estimating at least one of a decay constant or an internal resistance associated with the battery, using at least one of the constant voltage or the constant current, comparing the decay constant with a first threshold value or comparing the internal resistance with a second threshold value, and detecting an operating status of the battery to be faulty or healthy, based on the comparison.

20 Claims, 11 Drawing Sheets

(51) Int. Cl.
*G01R 31/371* (2019.01)
*H02J 7/00* (2006.01)
*G01R 31/367* (2019.01)

(52) U.S. Cl.
CPC ............ *G01R 31/389* (2019.01); *H02J 7/005* (2020.01); *H02J 7/0048* (2020.01); *H02J 7/0029* (2013.01)

(56) References Cited

U.S. PATENT DOCUMENTS

| | | | |
|---|---|---|---|
| 2002/0109506 A1* | 8/2002 | Kawakami | G01R 31/392 324/522 |
| 2006/0186859 A1 | 8/2006 | Fujikawa et al. | |
| 2009/0099802 A1* | 4/2009 | Barsoukov | G01R 31/3648 702/65 |
| 2010/0194398 A1 | 8/2010 | Kawasumi et al. | |
| 2011/0187329 A1* | 8/2011 | Majima | H01M 10/48 320/149 |
| 2013/0179012 A1 | 7/2013 | Hermann et al. | |
| 2014/0312910 A1* | 10/2014 | Cho | G01R 31/389 324/426 |
| 2014/0379188 A1* | 12/2014 | Uesaka | B60L 50/60 320/134 |
| 2017/0074918 A1 | 3/2017 | Stewart et al. | |
| 2017/0153290 A1* | 6/2017 | Sazhin | G01R 31/396 |
| 2018/0095141 A1 | 4/2018 | Wild et al. | |
| 2018/0267111 A1 | 9/2018 | Pilatowicz et al. | |
| 2021/0311100 A1* | 10/2021 | Sugisawa | G01R 27/08 |

FOREIGN PATENT DOCUMENTS

| | | |
|---|---|---|
| JP | 2010-181262 A | 8/2010 |
| JP | 2010-267472 A | 11/2010 |
| JP | 2012-88097 A | 5/2012 |
| JP | 2014-6205 A | 1/2014 |
| KR | 10-2004-0014922 A | 2/2004 |

OTHER PUBLICATIONS

Berecibar, M., et al., "Critical review of state of health estimation methods of Li-ion batteries for real applications," *Renewable and Sustainable Energy Reviews*, 56, 2016 (pp. 572-587).

Feng, Xuning, et al., "Online internal short circuit detection for a large format lithium ion battery," *Applied energy*, 161, 2016 (pp. 168-180).

Sazhin, Sergiy V. et al., "Enhancing Li-ion battery safety by early detection of nascent internal shorts," *Ecs Transactions*, 73, 1, 2016 (pp. 1-7).

* cited by examiner

METHOD AND SYSTEM FOR DETECTING OPERATING STATUS OF BATTERY

CROSS-REFERENCE TO RELATED APPLICATIONS

This application claims the benefit under 35 USC § 119(a) of Indian Patent Application No. 202041004910 filed on Feb. 4, 2020, in the Indian Patent Office, and Korean Patent Application No. 10-2020-0172624 filed on Dec. 10, 2020, in the Korean Intellectual Property Office, the entire disclosures of which are incorporated herein by reference for all purposes.

BACKGROUND

1. Field

The following description relates to a method and apparatus for detecting an operating status of a battery in a battery system that includes one or more batteries.

2. Description of Related Art

Battery systems include a battery including one or more cells configured to provide power to electrical devices, such as, for example, mobile phones, electric cars, and home appliances. For rechargeable batteries, such as lithium-ion batteries, it is important to detect health/operating status of such batteries. The health/operating status is detected using data collected in the field of the battery system.

Current approaches for detecting the operating status largely rely on coulomb efficiency, energy efficiency, and time-based charging or discharging. Such approaches work when a cell is charged from a completely discharged state to a completely charged state. However, in real-life applications, the occurrence of charging of a cell from a completely discharged state is rare. Estimation of the health includes determining an internal short in the battery through direct estimation of an internal resistance. However, for the determination of the internal resistance, an open circuit voltage (OCV) curve of the battery and a complex algorithm whose accuracy may depend on the accuracy of the OCV curve are used.

One or more other approaches include using multiple features derived from Matric current and voltage that are classified by statistical classifiers. Such statistical classifiers are to be trained in the battery system. Some approaches detect anomalies in a battery and associated load from current and voltage measurements of the battery in presence of complete discharge and charge. Other approaches include calculating a deviation of temperature of the battery from ambient temperature and a deviation of voltage from normal charging voltage. Such deviation may be used to predict an internal short in the battery. However, such assumptions and predictions may not be accurate, leading to false alerts on the health of the battery.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided a method of detecting an operating status of a battery in a battery system, the method including determining a charging profile of a battery in a battery system, identifying a constant voltage and a corresponding constant current in a charging cycle of the charging profile, estimating at least one of a decay constant or an internal resistance associated with the battery, using at least one of the constant voltage or the constant current, comparing the decay constant with a first threshold value or comparing the internal resistance with a second threshold value, and detecting an operating status of the battery to be faulty or healthy, based on the comparison.

The charging profile may be determined irrespective of a discharge state of the battery.

The detecting may include detecting the operating status of the battery to be faulty in response to the decay constant being less than or equal to the first threshold value, wherein the first threshold value may include a minimum value of the decay constant for triggering an internal short in the battery.

The detecting may include detecting the operating status of the battery to be faulty in response to the internal resistance being less than or equal to the second threshold value, wherein the second threshold value may include a minimum value of the internal resistance for triggering an internal short in the battery.

The method may include providing an alert regarding the faulty operating status of the battery, prior to an internal short occurring in the battery.

The detecting may include detecting the operating status of the battery to be healthy, in response to the decay constant being greater than the first threshold value and the internal resistance being greater than the second threshold value.

The detecting may include detecting the operating status of the battery to be healthy, in response to the decay constant being greater than the first threshold value.

The detecting may include detecting the operating status of the battery to be healthy, in response to the internal resistance being greater than the second threshold value.

The decay constant for the charging cycle may be estimated by applying an exponential decay model to the constant current in the charging cycle.

The internal resistance of the battery may be estimated using the constant voltage, the constant current, and open circuit voltage determined using an open circuit voltage (OCV)-state of charge (SOC) model of the battery.

A value of the internal resistance may indicate sensitivity of fault in the battery.

The method may include generating a notification comprising one or more remedies to avoid an internal short in the battery, upon detection of the operating status of the battery to be faulty.

In another general aspect, there is provided an apparatus for detecting an operating status of a battery in a battery system, the apparatus including a processor configured to determine a charging profile of a battery in a battery system, identify a constant voltage and a corresponding constant current in a charging cycle of the charging profile, estimate at least one of a decay constant or an internal resistance associated with the battery, using at least one of the constant voltage or the constant current, compare the decay constant with a first threshold value or compare the internal resistance with a second threshold value, and detect an operating status of the battery to be faulty or healthy, based on the comparison.

The charging profile may be determined irrespective of a discharge state of the battery.

The processor may be configured to detect the operating status of the battery to be faulty in response to the decay constant being less than or equal to the first threshold value, wherein the first threshold value may include a minimum value of the decay constant for triggering an internal short in the battery.

The processor may be configured to detect the operating status of the battery to be faulty in response to the internal resistance being less than or equal to the second threshold value, wherein the second threshold value may include a minimum value of the internal resistance for triggering an internal short in the battery.

The processor may be configured to detect the operating status of the battery to be healthy in response to the decay constant being greater than the first threshold value and the internal resistance being greater than the second threshold value.

The decay constant for the charging cycle may be estimated by applying an exponential decay model to the constant current in the charging cycle.

The internal resistance of the battery may be estimated using the constant voltage, the constant current, and open circuit voltage may be determined using an open circuit voltage (OCV)-state of charge (SOC) model of the battery.

A value of the internal resistance may indicate sensitivity of fault in the battery.

Other features and aspects will be apparent from the following detailed description, the drawings, and the claims.

Figure 1:
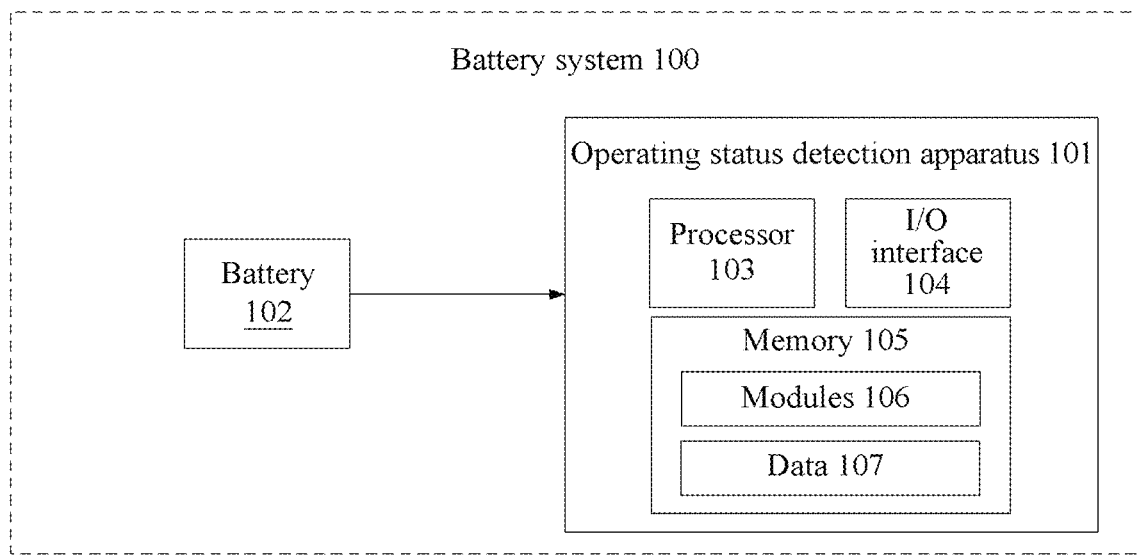
FIG. 1 illustrates an example of a brief configuration of an operating status detection apparatus for detecting an operating status of a battery in a battery system.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

The terminology used herein is for the purpose of describing particular examples only and is not to be limiting of the examples. The singular forms "a", "an", and "the" are intended to include the plural forms as well, unless the context clearly indicates otherwise. It will be further understood that the terms "comprises/comprising" and/or "includes/including" when used herein, specify the presence of stated features, integers, steps, operations, elements, and/or components, but do not preclude the presence or addition of one or more other features, integers, steps, operations, elements, components and/or groups thereof.

When describing the examples with reference to the accompanying drawings, like reference numerals refer to like constituent elements and a repeated description related thereto will be omitted. In the description of examples, detailed description of well-known related structures or functions will be omitted when it is deemed that such description will cause ambiguous interpretation of the present disclosure.

Terms, such as first, second, and the like, may be used herein to describe components. Each of these terminologies is not used to define an essence, order or sequence of a corresponding component but used merely to distinguish the corresponding component from other component(s). For example, a first component may be referred to as a second component, and similarly the second component may also be referred to as the first component. In addition, terms such as first, second, A, B, (a), (b), and the like may be used herein to describe components. Each of these terminologies is not used to define an essence, order, or sequence of a corresponding component but used merely to distinguish the corresponding component from other component(s).

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween. Likewise, expressions, for example, "between" and "immediately between" and "adjacent to" and "immediately adjacent to" may also be construed as described in the foregoing.

The terminology used herein is for the purpose of describing particular examples only, and is not to be used to limit the disclosure. As used herein, the singular forms "a," "an," and "the" are intended to include the plural forms as well, unless the context clearly indicates otherwise. As used herein, the term "and/or" includes any one and any combination of any two or more of the associated listed items. As used herein, the terms "include," "comprise," and "have"

specify the presence of stated features, numbers, operations, elements, components, and/or combinations thereof, but do not preclude the presence or addition of one or more other features, numbers, operations, elements, components, and/or combinations thereof.

The constituent element, which has the same common function as the constituent element included in any one example, will be described by using the same name in other examples. Unless disclosed to the contrary, the configuration disclosed in any one example may be applied to other examples, and the specific description of the repeated configuration will be omitted.

Hereinafter, a method and apparatuses for detecting an operating status of a battery in a battery system will be described in detail with reference to FIGS. 1 to 6.

The present disclosure relates to an apparatus and method for detecting an operating status of a battery without assuming complete charging and discharging cycles of the battery, and may be implemented in a real-life condition where the battery may be charged from a partially discharged state.

The present disclosure is directed to considering a constant voltage part of a charging profile of the battery and measure a charging current from the charging profile. A decay constant using the charging current and an internal resistance using the entire charging profile are estimated. The decay constant and the internal resistance are used to understand the operating status of the battery. The present disclosure provides advantage where, when implemented on field data, due to its merit of independency on initial discharge state, a user may be alerting on progressing fault before the fault worsens.

FIG. 1 illustrates an example of a brief configuration of an operating status detection apparatus 101 for detecting an operating status of a battery in a battery system 100.

Referring to FIG. 1, the battery system 100 may include one or more batteries which are configured to provide power to electrical devices. The batteries of the battery system 100 may need to be monitored regularly. The battery system 100 may include a battery management system that manages to protect the battery 102 from operating outside its safe operating area, monitor its state, calculate secondary data, report that data, control its environment, and authenticate the battery 102. Also, the battery management system may be configured to detect the operating status or health of the battery 102 regularly. Detection of the operating status may include detecting the battery 102 to be healthy or faulty.

In the battery system 100 with lithium-ion batteries, failure may be due to an internal short in the battery 102. The internal short in the battery 102 may be triggered by various causes. Usually, the internal short may occur because of an overheated cell. The heat increasingly damages the battery 102, creating a vicious cycle of short circuits.

The operating status detection apparatus 101 may be configured to predict the internal short in the battery 102. In an example, the operating status detection apparatus 101 may be an integral part of the battery management system. In another example, the operating status detection apparatus 101 may be a standalone apparatus in the battery system 100, in connection with the battery 102 in the battery system 100 (as shown in FIG. 1).

The operating status detection apparatus 101 may include a processor 103, an input/output (I/O) interface 104, and a memory 105. The memory 105 stores instructions, executable by the processor 103, which on execution, may cause the operating status detection apparatus 101 to detect the operating status of the battery 102. The memory 105 may include one or more modules 106 and data 107. The one or more modules 106 may be configured to perform the operations of the present disclosure using the data 107, to detect the operating status of the battery 102, as disclosed in the present disclosure. Each of the one or more modules 106 may be a hardware unit which may be outside the memory 105 and coupled with the operating status detection apparatus 101. The operating status detection apparatus 101 may be implemented in a variety of computing systems, such as a laptop computer, a desktop computer, a personal computer (PC), a notebook, a smartphone, a tablet, an e-book reader, a server, a vehicle, and a network server.

For detecting the operating status of the battery 102, the operating status detection apparatus 101 may be configured to compute a charging profile of the battery 102. The charging profile may indicate variation of current and variation with respect to time and state of the battery 102. The state of the battery 102 may be a charging state or a discharging state. The operating status detection apparatus 101 may be configured to compute the charging profile irrespective of the discharge state of the battery 102. The charging profile may be a plot indicating changes in voltage and current measured for the battery 102, with respect to time. In this example, the charging profile of the battery 102 includes a charging cycle and a discharging cycle. The charging cycle may include changes in voltage and current measured for the battery 102, with respect to time, during the charging of the battery 102. The discharging cycle may include changes in voltage and current measured for the battery 102, with respect to time, during the discharging of the battery 102.

The operating status detection apparatus 101 may be configured to identify constant voltage and corresponding constant current in the charging cycle of the charging profile. In an example, reading of the plot may be referred to identify the constant voltage and the corresponding constant current.

The operating status detection apparatus 101 may be configured to estimate at least one of a decay constant and an internal resistance associated with the battery 102. Current in the battery 102 reduces exponentially with time. The decay constant is a quantity describing a rate of reduction of the current in the battery 102. The decay constant may also be referred to as a decay parameter. The internal resistance is the resistance which is present within the battery 102 that resists current flow when connected to a circuit. Thus, the internal resistance causes a voltage drop when current flows through the battery 102. In an example, the decay constant and the internal resistance may be used by the operating status detection apparatus 101 to differentiate whether the battery 102 is faulty and healthy.

The operating status detection apparatus 101 may be configured to estimate the decay constant using only the charging cycle of the charging profile. The decay constant may be estimated by applying an exponential decay model to the constant current in the charging cycle. The exponential decay model may be a function for the process of reducing an amount by a consistent percentage rate over a period of time.

For estimating the internal resistance, the operating status detection apparatus 101 may be configured to consider the entire charging profile of the battery 102. The internal resistance may be estimated by considering an open circuit voltage (OCV)-state of charge (SOC) model of the battery 102. The OCV-SOC model may be plotted using the constant voltage and constant current identified from the charging profile. Further, using the OCV-SOC model, the open circuit voltage associated with the battery 102 may be determined.

Upon estimation of at least one of the decay constant and the internal resistance, the operating status detection apparatus 101 may compare the estimated decay constant and the internal resistance with a first threshold value and a second threshold value, respectively. In an example, the operating status detection apparatus 101 may be configured to compare the decay constant with the first threshold value and compare the internal resistance with the second threshold value. In this example, the first threshold value may be derived by understanding variation of the decay constant with multiple values of internal short resistance. The first threshold value may indicate a minimum value of a decay constant for triggering an internal short in the battery 102. Similarly, the second threshold value may be derived by understanding variation of the internal resistance with multiple values of internal short resistance. The second threshold value may indicate a minimum value of an internal resistance for triggering an internal short in the battery 102.

The operating status detection apparatus 101 may be configured to detect the operating status of the battery 102 to be one of faulty and healthy, based on the comparison. In this example, the operating status of the battery 102 may be detected to be faulty when the decay constant is determined to be less than or equal to the first threshold value. The operating status of the battery 102 may be detected to be faulty when the internal resistance is determined to be less than the second threshold value. Here, the value of the internal resistance may indicate the sensitivity of fault in the battery 102.

The operating status of the battery 102 may depend on the decay constant, or the internal resistance, or both the decay constant and the internal resistance. The operating status detection apparatus 101 may be configured to detect the operating status to be faulty even if one of the decay constant and the internal resistance is not within the respective threshold value. The operating status detection apparatus 101 may be configured to detect the operating status of the battery 102 to be healthy when the decay constant is determined to be greater than the first threshold value and the internal resistance is determined to be greater than the second threshold value.

In an example, the operating status detection apparatus 101 may be configured to detect the operating status of the battery 102 based on the decay constant only. In another example, the operating status detection apparatus 101 may be configured to detect the operating status of the battery 102 based on the internal resistance only. In another example, the operating status detection apparatus 101 may be configured to detect the operating status of the battery 102 based on both the decay constant and the internal resistance.

By comparing the decay constant and the internal resistance with the first threshold value and the second threshold value, respectively, the operating status detection apparatus 101 may be configured to detect the operating status of battery 102 to be faulty even before a complete failure occurs in the battery 102. In this example, the failure may be an internal short in the battery 102. The operating status detection apparatus 101 may be configured to provide an alert for detection of the operating status to be faulty, before the internal short occurs in the battery 102. The alert may be provided to a user associated with the battery system 100, for taking precautions when operating the battery system 100. One or more techniques, such as displaying the alert on a display, may be implemented to alert the operating status to be faulty. The operating status detection apparatus 101 may be configured to generate a notification including one or more remedies to avoid the internal short in the battery 102, upon detection of the operating status of the battery 102 to be faulty. The one or more remedies may provide recovery from the faulty operating status of the battery 102. The one or more remedies may be provided to avoid further faults/internal shorts in the battery 102.

The operating status detection apparatus 101 may be a dedicated server or a cloud-based server in communication with the battery 102. The operating status detection apparatus 101 may communicate with the battery 102 via a communication network (not shown). The communication network may include a direct interconnection, a peer-to-peer (P2P) network, a local area network (LAN), a wide area network (WAN), a wireless network (for example, using Wireless Application Protocol), a controller area network (CAN), the Internet, or Wi-Fi. The operating status detection apparatus 101 may be associated with a plurality of batteries, to detect the operating status of each of the plurality of batteries. The operating status detection apparatus 101 may be associated with a plurality of battery systems with a plurality of batteries. The operating status detection apparatus 101 may communicate with each of the batteries or battery system 100, via the dedicated communication network. The operating status detection apparatus 101 may be an integral part of the battery system 100 or externally connected to the battery system 100. The I/O interface 104 of the operating status detection apparatus 101 may assist in transmitting and receiving data. Received data may include the charging profile, the first threshold value, and the second threshold value. Transmitted data may include the estimated decay constant, the internal resistance, the operating status, the alert, and the notification. One or more other data, which are associated with detecting the operating status, may be received and transmitted via the I/O interface 104.

Figure 2:
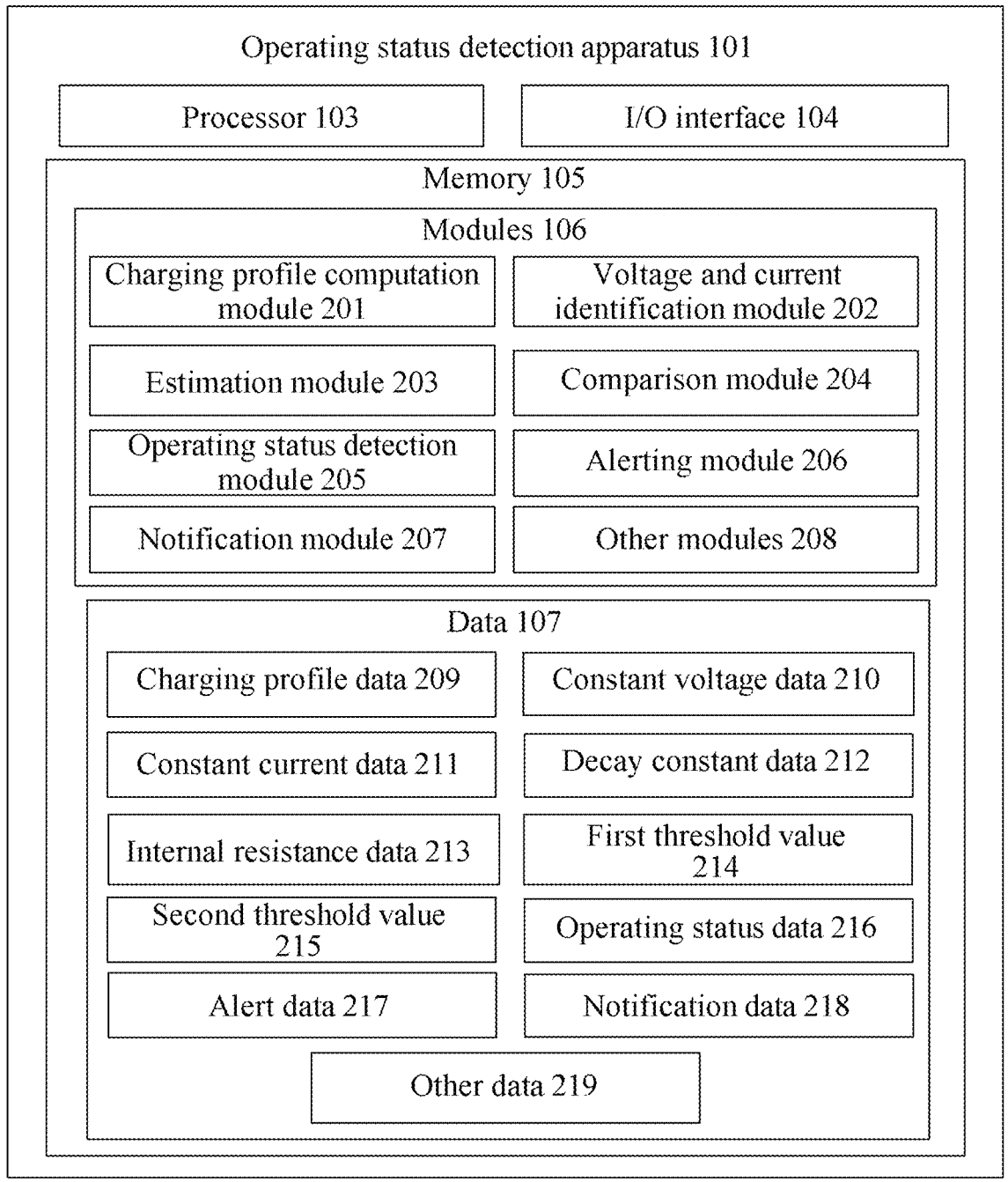
FIG. 2 illustrates an example of another configuration of an operating status detection apparatus for detecting an operating status of a battery in a battery system.

FIG. 2 illustrates an example of a configuration of the operating status detection apparatus 101 for detecting an operating status 216 of the battery 102 in the battery system 100.

Referring to FIG. FIG. 2, the memory 105 of the operating status detection apparatus 101 may include the data 107 and the one or more modules 106.

In this example, the one or more modules 106 may include a charging profile computation module 201, a voltage and current identification module 202, an estimation module 203, a comparison module 204, an operating status detection module 205, an alerting module 206, a notification module 207, and one or more other modules 208, associated with the operating status detection apparatus 101.

The data 107 in the memory 105 may include charging profile data 209 (also referred to as a charging profile 209), constant voltage data 210 (also referred to as constant voltage 210), constant current data 211 (also referred to as constant current 211), decay constant data 212 (also referred to as decay constant 212), internal resistance data 213 (also referred to as internal resistance 213), a first threshold value 214, a second threshold value 215, operating status data 216 (also referred to as operating status 216), alert data 217 (also referred to as alerts 217), notification data 218 (also referred to as notification 218), and other data 219 associated with the operating status detection apparatus 101.

The data 107 in the memory 105 may be processed by the one or more modules 106 of the operating status detection apparatus 101. Here, the one or more modules 106 may be implemented as dedicated units, and when implemented in such a manner, said modules may be configured with the functionality defined in the present disclosure to result in novel hardware. As used herein, the term module may refer to an application-specific integrated circuit (ASIC), an electronic circuit, a field-programmable gate array (FPGA), a programmable system-on-chip (PSoC), a combinational logic circuit, and/or other suitable components that provide the described functionality. Further details regarding the modules are provided below.

Battery systems may be implemented in electric vehicles, mobile phones, laptops, and stationary energy storage systems. Batteries used in such battery systems may be lithium-ion batteries which are prone to internal shorts. The present disclosure provides early detection of an internal short in the battery 102 to prevent catastrophic failure. The apparatus and method proposed herein include detecting an operating status 216 of the battery 102 to be used to predict an internal short in the battery 102. The operating status of the battery 102 may also be referred to as a state of health of the battery, a health of the battery, or a state or status of the battery. The detected operating status 216 may be one of faulty and healthy. The operating status 216 to be faulty may indicate that the battery 102 may undergo an internal short.

For detecting the operating status 216 of the battery 102, the charging profile computation module 201 may compute the charging profile 209 of the battery 102. In this example, the charging profile 209 may be a plot indicating changes in voltage and current measured for the battery 102, with respect to time.

Figure 3A:
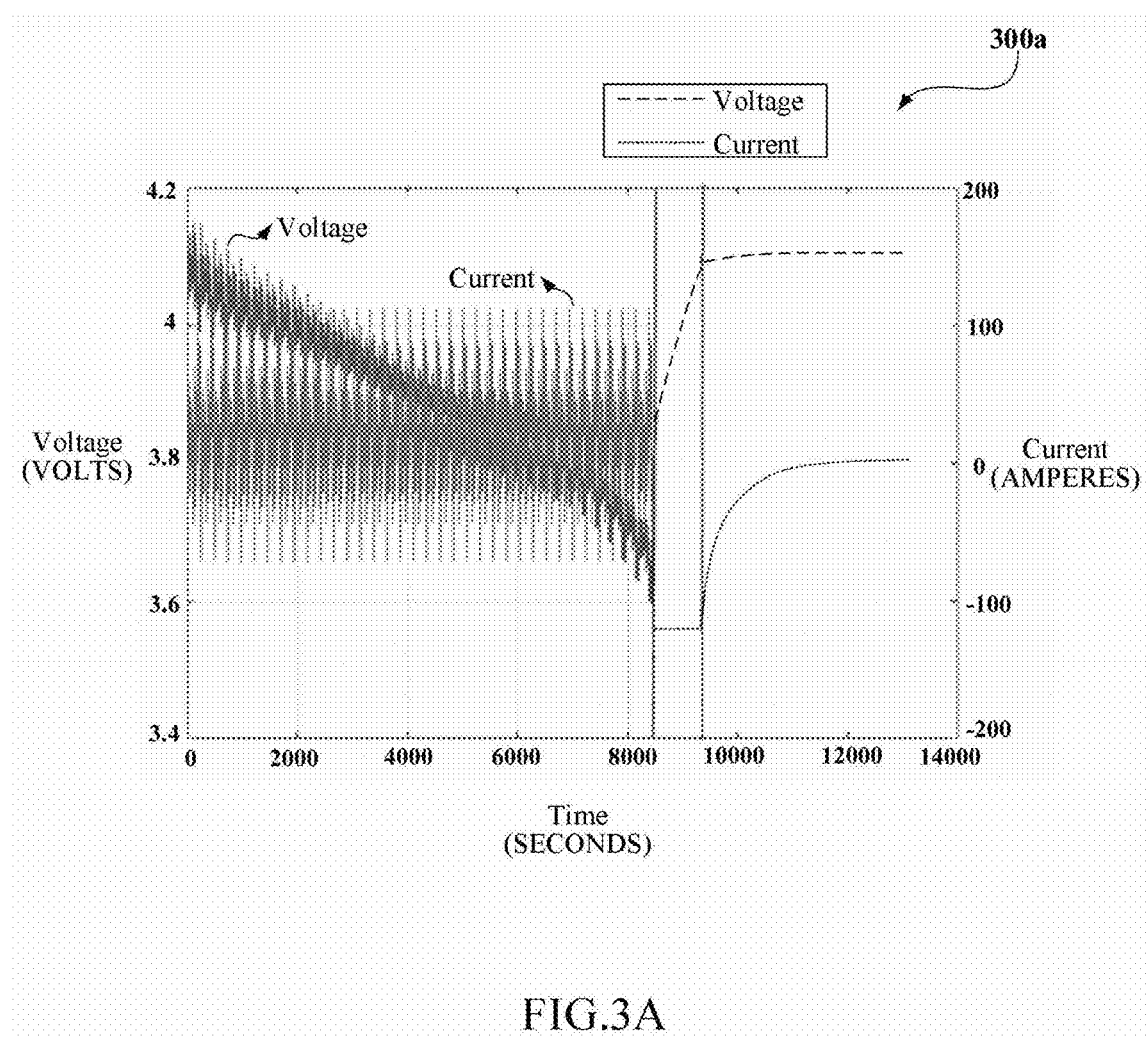
FIGS. 3A to 3C illustrate examples of plots for estimating a decay constant.

An example of the charging profile 209 is shown in FIG. 3A as a plot 300a. In FIG. 3A, the plot 300a is a simulation of a drive cycle on an electrochemical and thermal (ECT) model. It may be considered that the simulation of the drive cycle is performed during regenerative braking of an electric vehicle. The variations in the voltage and the current are shown in the plot 300a.

In another example, the charging profile 209 may be in form of a table with values of voltage, current, and time, and other forms of charging profile 209 may be computed by the charging profile computation module 201, without departing from the sprit and scope of the illustrative examples described. In the present disclosure, the charging profile 209 is computed without considering the discharging state of the battery 102. Thus, the proposed method for detecting the operating status 216 is independent of the discharging state of the battery 102.

Upon computing the charging profile 209, the voltage and current identification module 202 may be configured to identify constant voltage 210 and corresponding constant current 211 from the charging profile 209. The charging profile 209 in the plot 300a may be considered. The constant voltage 210 in the charging cycle of the plot 300a may be considered for detecting the operating status 216 of the battery 102. In this example, the corresponding constant current 211 for the constant voltage 210 is computed and used for the detection. The values of the constant current and the constant voltage may depend on the type and capacity of the battery 102. For example, the constant current for a 4000-mAh battery may be 4 amperes, and constant current charging may be at 1 Coulomb rate. The voltage of constant voltage for a lithium-ion battery may be 4 Volts. The constant voltage may also depend on the chemistry of the battery 102.

Upon the identification, the estimation module 203 may be configured to estimate at least one of the decay constant 212 and the internal resistance 213 associated with the battery 102. At least one of the decay constant 212 and the internal resistance are used as a differentiating factor to detect the battery 102 to be one of faulty and healthy.

The estimation module 203 may be configured to estimate the decay constant 212 using only the charging cycle of the charging profile 209.

Figure 3B:
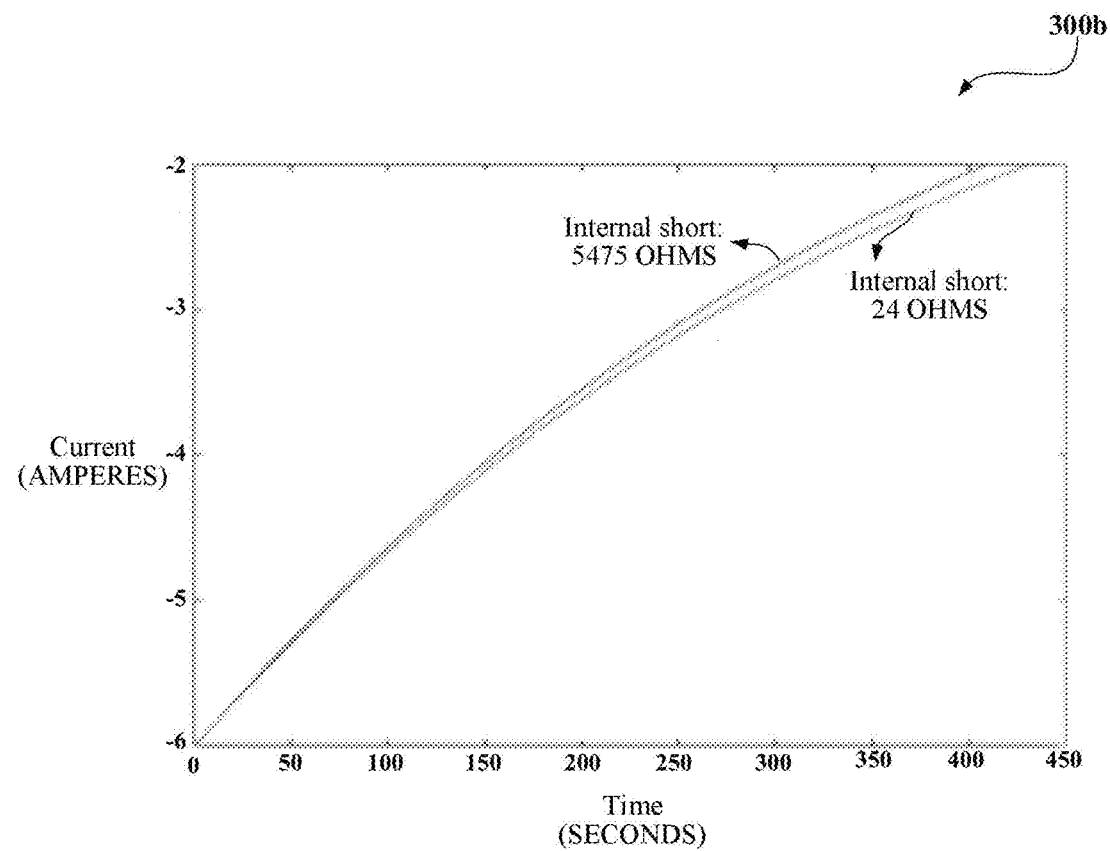

A plot 300b of FIG. 3B showing a decay of charging current, during constant voltage 210, with different values of internal short resistance, may be considered. The values of internal short resistance considered in FIG. 3B are 5475 ohms and 24 ohms. The estimation module 203 is configured to estimate the decay constant 212 by applying an exponential decay model to the constant current 211 in the charging cycle.

In this example, the exponential decay model may be represented as Equation 1 given below.

$$I = A*\text{Exp}(-t*B) \qquad \text{[Equation 1]}$$

In Equation 1, I is the constant current 211, A is the initial value of function, t is a time instant, and B is the decay constant.

The decay constant 212 "B" determined using Equation 1 may be used for detecting the operating status 216 of the battery 102.

Further, the estimation module 203 may be configured to estimate the internal resistance 213. The estimation module 203 may consider the entire charging profile 209 of the battery 102 to estimate the internal resistance 213.

An equivalent circuit of the battery 102 is considered for estimating the internal resistance.

Figure 4A:
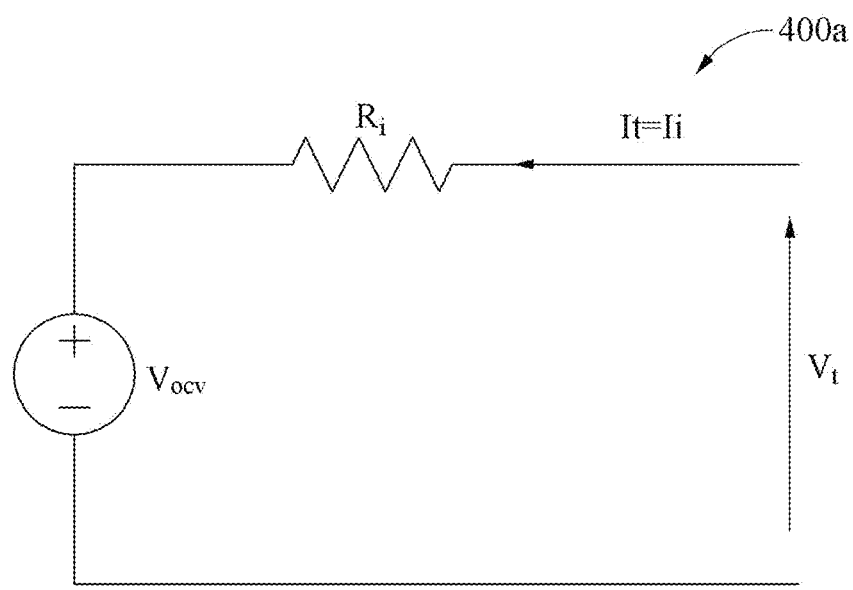
FIGS. 4A to 4C illustrate examples of plots for estimating an internal resistance.
Figure 4B:
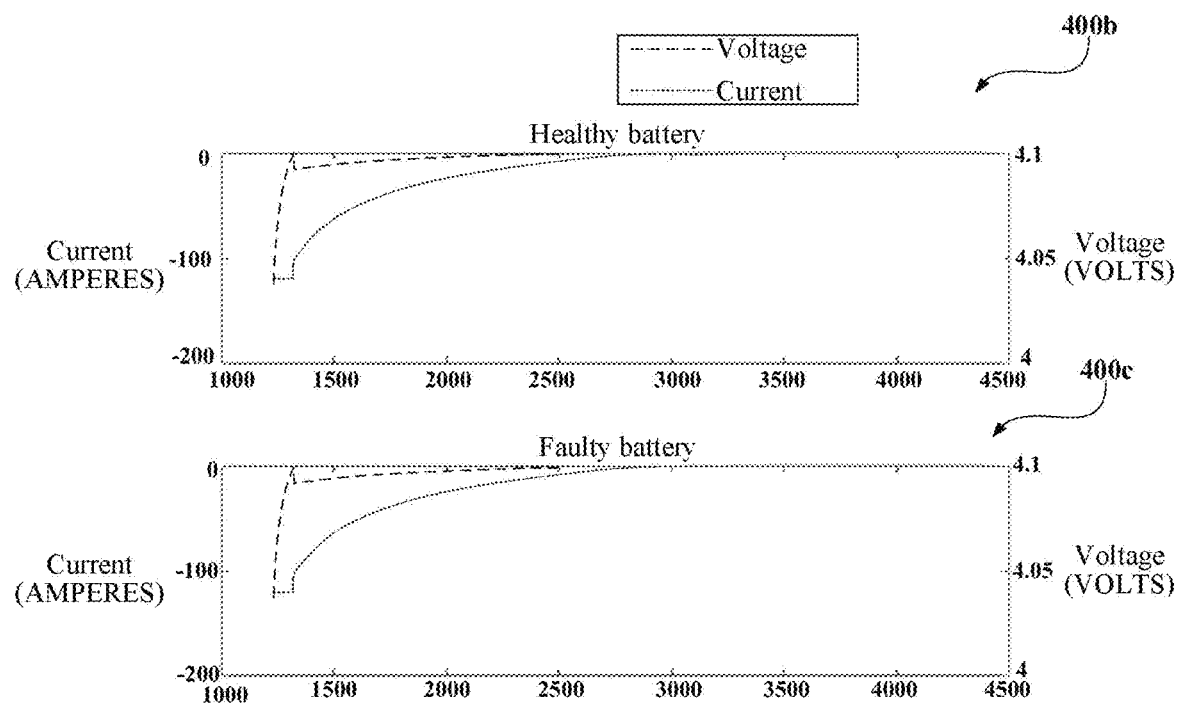
Figure 4C:
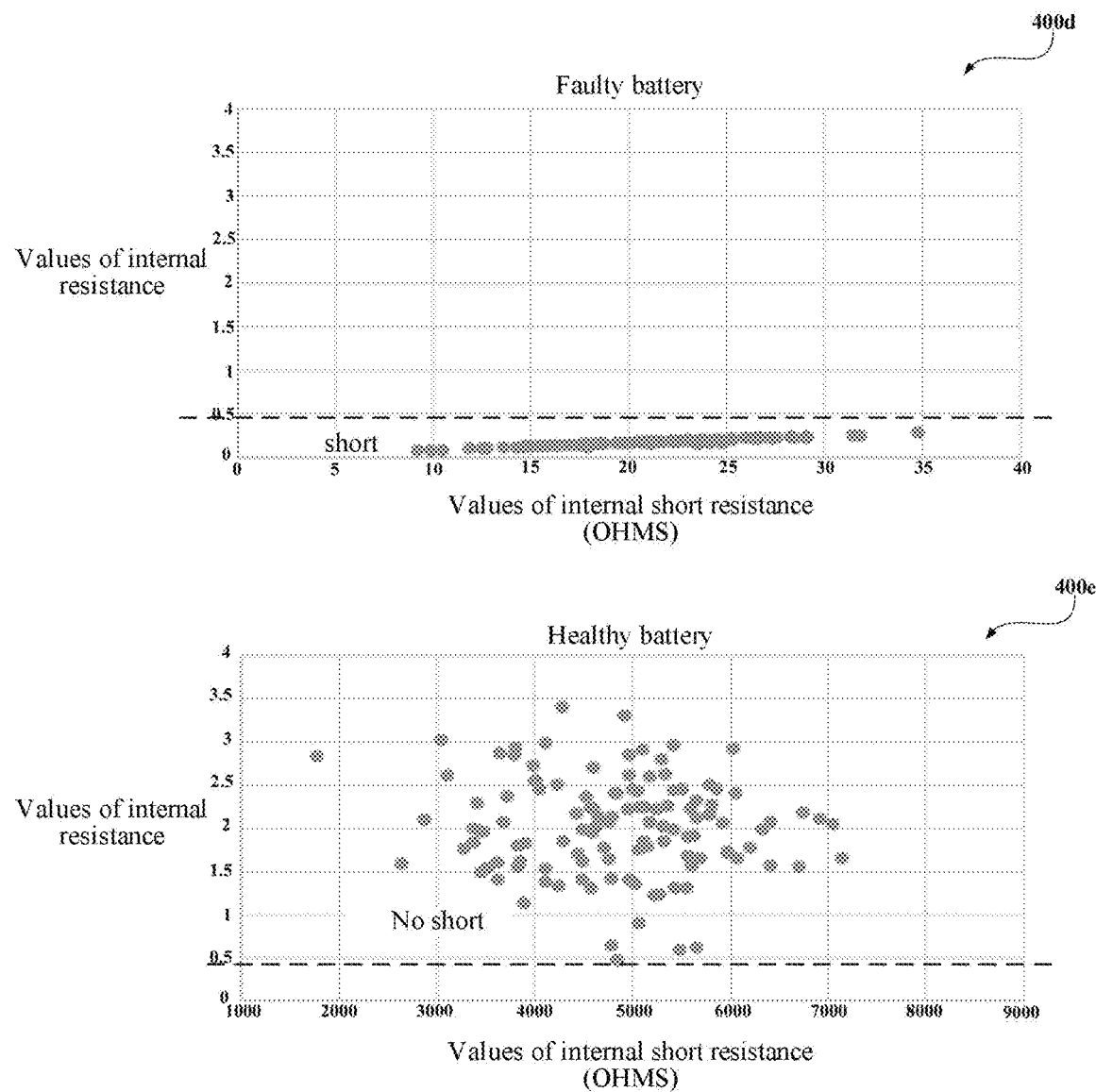

FIGS. 4A to 4C illustrate examples of plots for estimating an internal resistance.

An example of an equivalent circuit 400a is shown in FIG. 4A.

The internal resistance 213 may be estimated by considering the OCV-SOC model of the battery 102. The OCV-SOC model may be plotted using the constant voltage 210 and constant current 211 identified from the charging profile 209. Further, using the OCV-SOC model, an open circuit voltage associated with the battery 102 is determined. In the equivalent circuit 400a, $V_{ocv}$ represents the open circuit voltage, $R_i$ represents the internal resistance 213, $V_t$ represents the voltage drop across the battery 102, and $I_t$ represents the current through the battery 102.

FIG. 4B shows plots 400b and 400c representing charging profiles 209 for different values of internal shorts.

The plot 400b represents the charging profile 209 for a healthy battery. Further, the plot 400c represents the charging profile 209 for a faulty battery.

The internal resistance 213 "$R_i$" may be estimated using the Kalman filter with Equation 2 given below.

$$V_t = V_{ocv} + R_i \times It \qquad \text{[Equation 2]}$$

In Equation 2, $V_{ocv}$ represents the open circuit voltage, $R_i$ represents the internal resistance 213, $V_t$ represents the voltage drop across the battery 102, and $I_t$ represents the current through the battery 102.

The internal resistance 213 determined using Equation 2 may be used for detecting the operating status 216 of the battery 102.

Upon estimation of at least one of the decay constant 212 and the internal resistance 213, the comparison module 204 may be configured to compare the estimated decay constant 212 with the first threshold value 214 and the internal resistance 213 with the second threshold value 215.

The first threshold value 214 may be derived by understanding variation of the decay constant 212 with multiple values of internal short resistance.

Figure 3C:
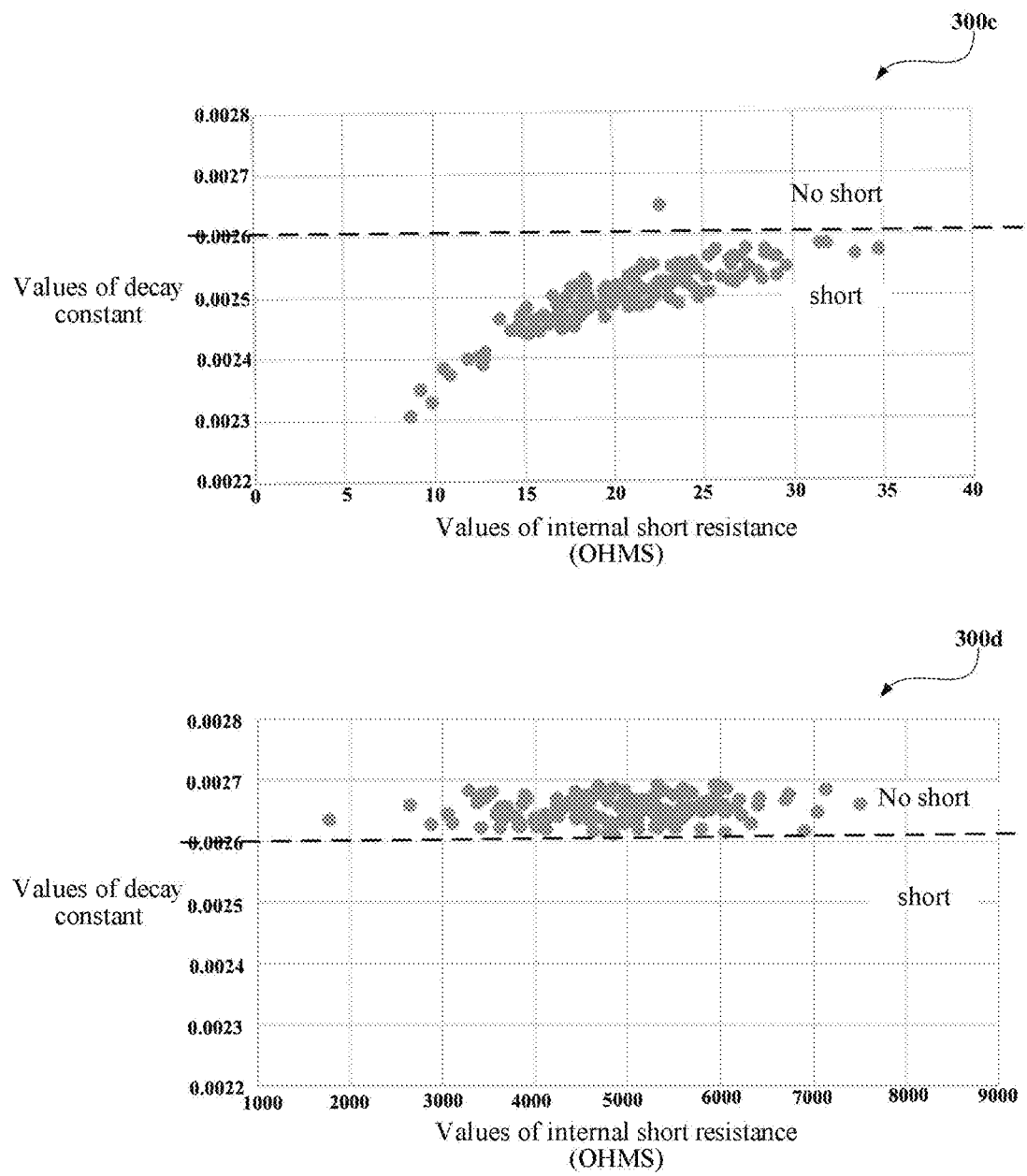

FIG. 3C shows exemplary plots 300*c* and 300*d* illustrating variation of the decay constant 212 with multiple values of the internal short resistance.

Referring to FIG. 3C, for varying values of the decay constant 212, it may be observed that below a certain-value of the decay constant 212 (approximately 0.0026), the battery 102 undergoes an internal short. For varying values of the decay constant 212, it may be observed that above the value of approximately 0.0026, the battery 102 does not undergo an internal short. From the plots 300*c* and 300*d*, the first threshold value 214 may be derived to be 0.0026. In this example, the first threshold value 214 may indicate a minimum value of the decay constant 212 which triggers an internal short in the battery 102.

Similarly, the second threshold value 215 may be derived by understanding variation of the decay constant 212 with multiple values of internal short resistance.

FIG. 4C shows exemplary plots 400*d* and 400*e* illustrating variation of the decay constant 212 with multiple values of the internal short resistance.

Referring to FIG. 4C, for varying values of the internal resistance 213, it may be observed that below a predetermined value of the internal resistance 213 (approximately 0.4), the battery 102 undergoes an internal short. For varying values of the internal resistance 213, it may be observed that above the value of approximately 0.4, the battery 102 does not undergo an internal short.

From the plots 400*d* and 400*e*, the second threshold value 215 may be derived to be 0.4. In this example, the second threshold value 215 may indicate a minimum value of the decay constant 212 which triggers an internal short in the battery 102.

In an example, the other modules 208 in the operating status detection apparatus 101 may be configured to derive the first threshold value 214 and the second threshold value 215. Other techniques may be implemented in the operating status detection apparatus 101, for deriving the first threshold value 214 and the second threshold value 215, without departing from the sprit and scope of the illustrative examples described. The first threshold value 214 and the second threshold value 215 and re-stored in the memory 105. Using the first threshold value 214 and the second threshold value 215, the comparison module 204 may perform a comparison.

Based on the comparison, the operating status detection module 205 may be configured to detect the operating status 216 of the battery 102 to be one of faulty and healthy. The operating status 216 of the battery 102 may be detected to be faulty when the decay constant 212 is determined to be less than or equal to the first threshold value 214. The operating status 216 of the battery 102 may be detected to be faulty when the internal resistance 213 is determined to be less than or equal to the second threshold value 215. The operating status 216 of the battery 102 may depend on the decay constant 212, or the internal resistance 213, or both the decay constant 212 and the internal resistance 213.

The operating status detection module 205 may be configured to detect the operating status 216 of the battery 102 to be healthy when the decay constant 212 is determined to be greater than the first threshold value 214 and the internal resistance 213 is determined to be greater than the second threshold value 215.

In an example, the operating status detection module 205 may be configured to detect the operating status 216 of the battery 102 to be healthy when the decay constant 212 is determined to be greater than the first threshold value 214, or the operating status detection module 205 may be configured to detect the operating status 216 of the battery 102 to be healthy when the internal resistance 213 is determined to be greater than the second threshold value 215.

Upon detecting the operating status 216 to be faulty, the alerting module 206 may be configured to provide the alert 217. The alert 217 may be instantaneously provided to a user before an internal short occurs in the battery 102. The alert may indicate that the battery 102 is in a condition to undergo an internal short. The alerting module 206 may be interfaced with one or more output modules of the battery system 100, to provide the alert 217. The one or more output modules may include a graphical user interface (GUI), a speaker, and a messaging module associated with the battery system 100. For example, for a battery system 100 implemented in a mobile phone, when the operating status 216 is detected to be faulty, the alert 217 may be provided via a GUI of the mobile phone or as a message or a pop-up notification. The value of the estimated internal resistance 213 may indicate the sensitivity of the fault in the battery 102. In an example, the alerts may include the sensitivity of the fault as well.

Along with the alert 217, the notification module 207 may be configured to generate the notification 218 including one or more remedies to avoid an internal short in the battery 102. The notification 218 may be provided along with the alert 217 via the one or more output modules. In this example, the one or more remedies may provide recovery from the faulty operating status of the battery 102. For example, the notification 218 may indicate the user to switch off the mobile phone. Other remedies may include reducing power consumption of a device associated with the battery 102 and putting the device in a sleep mode, and isolating the battery 102 and storing the battery 102 in a safe place.

Upon detection of the operating status 216 to be faulty, at least one of the other modules 208 in the operating status detection apparatus 101 may be configured to provide isolation of the battery 102 from other batteries or subsystems in the battery system 100. Isolation may help in reducing the impact of a failed battery on the other batteries or subsystems in the battery system 100.

The other data 219 may store data including temporary data and temporary files, generated by modules for performing the various functions of the operating status detection apparatus 101. The one or more modules 106 may also include the other modules 208 to perform various miscellaneous functionalities of the operating status detection apparatus 101. Such modules may be represented as a single module or a combination of different modules.

Figure 5A:
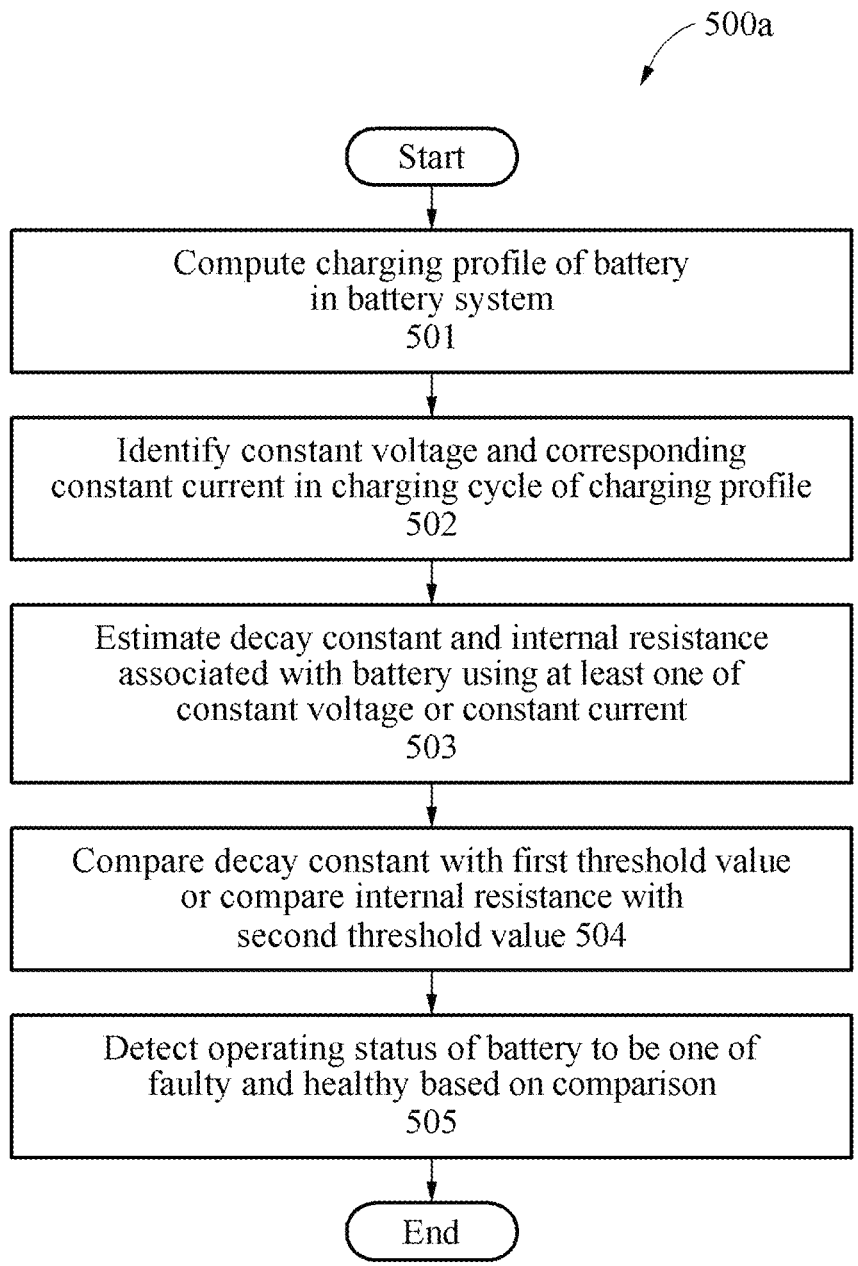
FIG. 5A illustrates an example of a process of detecting an operating status of a battery in a battery system.

FIG. 5A illustrates an example of a process 500*a* of detecting the operating status 216 of the battery 102 in the battery system 100. The operations in FIG. 5A may be performed in the sequence and manner as shown, although the order of some operations may be changed or some of the operations omitted without departing from the spirit and scope of the illustrative examples described. Many of the operations shown in FIG. 5A may be performed in parallel or concurrently. One or more blocks of FIG. 5A, and combinations of the blocks, can be implemented by special purpose hardware-based computer, such as a processor, that perform the specified functions, or combinations of special purpose hardware and computer instructions. In addition to the description of FIG. 5A below, the descriptions of FIGS. 1-4 are also applicable to FIG. 5A, and are incorporated herein by reference. Thus, the above description may not be repeated here.

Referring to FIG. 5A, in operation 501, the charging profile computation module 201 of the operating status detection apparatus 101 may compute the charging profile 209 of the battery 102 in the battery system 100. In this example, the charging profile 209 is computed irrespective of a discharge state of the battery 102.

In operation 502, the voltage and current identification module 202 of the operating status detection apparatus 101 may identify the constant voltage 210 and the corresponding constant current 211 in the charging cycle of the charging profile 209.

In operation 503, the estimation module 203 of the operating status detection apparatus 101 may estimate at least one of the decay constant 212 and the internal resistance 213 associated with the battery 102, using at least one of the constant voltage 210 and the constant current 211.

In operation 504, the comparison module 204 of the operating status detection apparatus 101 may compare at least one of the decay constant 212 and the internal resistance 213 with the first threshold value 214 and the second threshold value 215, respectively.

In operation 505, the operating status detection module 205 of the operating status detection apparatus 101 may detect the operating status 216 of the battery 102 to be one of faulty and healthy, based on the comparison.

Figure 5B:
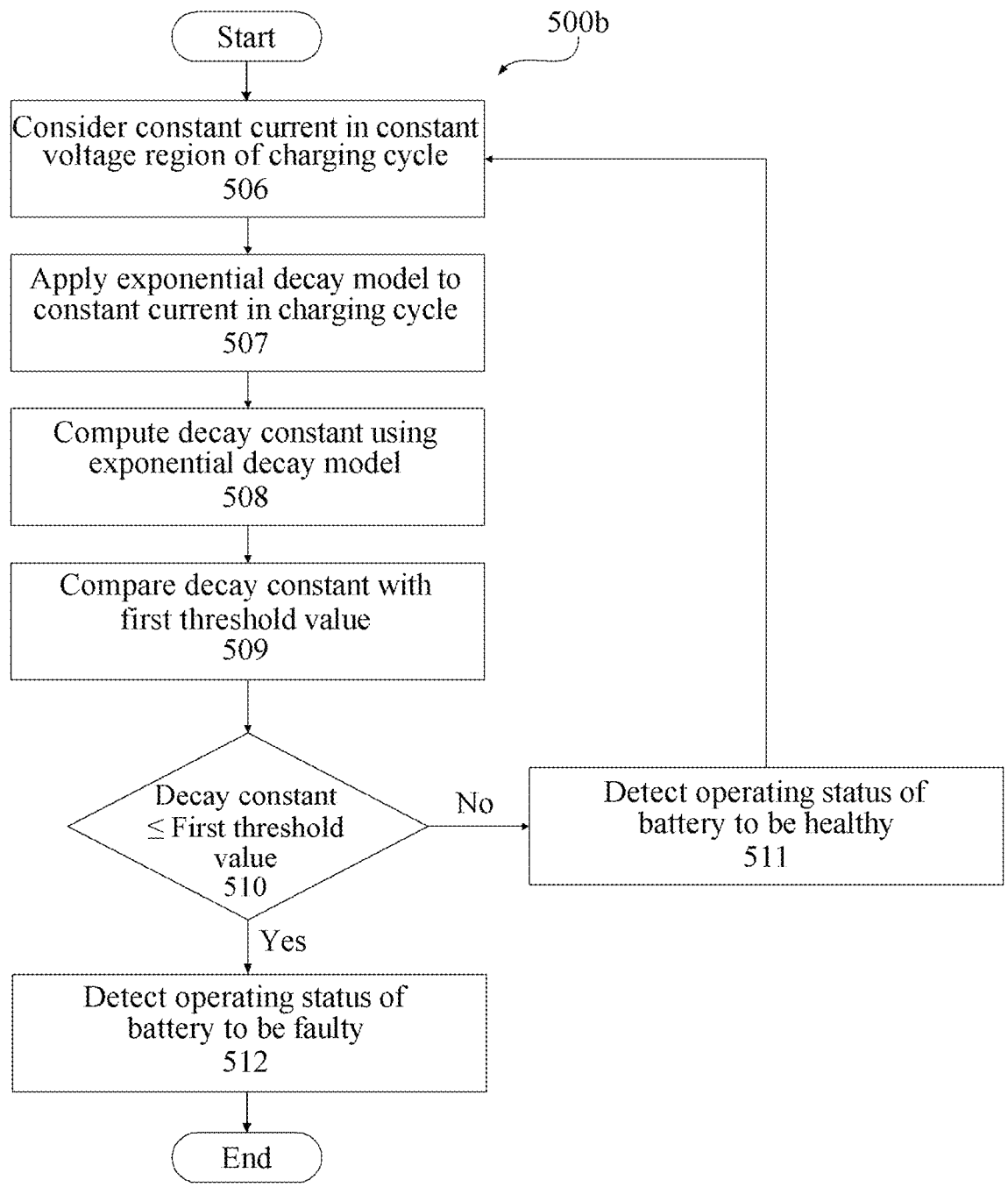
FIG. 5B illustrates an example of a process of detecting an operating status of a battery using a decay constant.

FIG. 5B illustrates an example of a process 500b of detecting the operating status 216 of the battery 102 using the decay constant 212. The operations in FIG. 5B may be performed in the sequence and manner as shown, although the order of some operations may be changed or some of the operations omitted without departing from the spirit and scope of the illustrative examples described. Many of the operations shown in FIG. 5B may be performed in parallel or concurrently. One or more blocks of FIG. 5B, and combinations of the blocks, can be implemented by special purpose hardware-based computer, such as a processor, that perform the specified functions, or combinations of special purpose hardware and computer instructions. In addition to the description of FIG. 5B below, the descriptions of FIGS. 1-5A are also applicable to FIG. 5B, and are incorporated herein by reference. Thus, the above description may not be repeated here.

Referring to FIG. 5B, in operation 506, the estimation module 203 of the operating status detection apparatus 101 may consider the constant current 211 in a region of the constant voltage 210 of the charging cycle.

In operation 507, the estimation module 203 of the operating status detection apparatus 101 may apply an exponential decay model to the constant current 211 in the charging cycle.

In operation 508, the estimation module 203 of the operating status detection apparatus 101 may compute the decay constant 212 using the exponential decay model.

In operation 509, the estimation module 203 of the operating status detection apparatus 101 may compare the decay constant 212 with the first threshold value 214.

In operation 510, the estimation module 203 of the operating status detection apparatus 101 may verify whether the decay constant 212 is less than or equal to the first threshold value 214.

In operation 511, when the decay constant 212 is greater than the first threshold value 214, the estimation module 203 of the operating status detection apparatus 101 may detect the operating status 216 to be healthy.

Upon detection of the operating status 216 to be healthy, operations 506 to 511 may be repeated, until the operating status 216 is detected to be faulty.

In operation 512, when the decay constant 212 is less than or equal to the first threshold value 214, the estimation module 203 of the operating status detection apparatus 101 may detect the operating status 216 to be faulty.

Upon detection of the operating status 216 to be faulty, the alert 217 and the notification 218 may be provided for the battery 102.

Figure 5C:
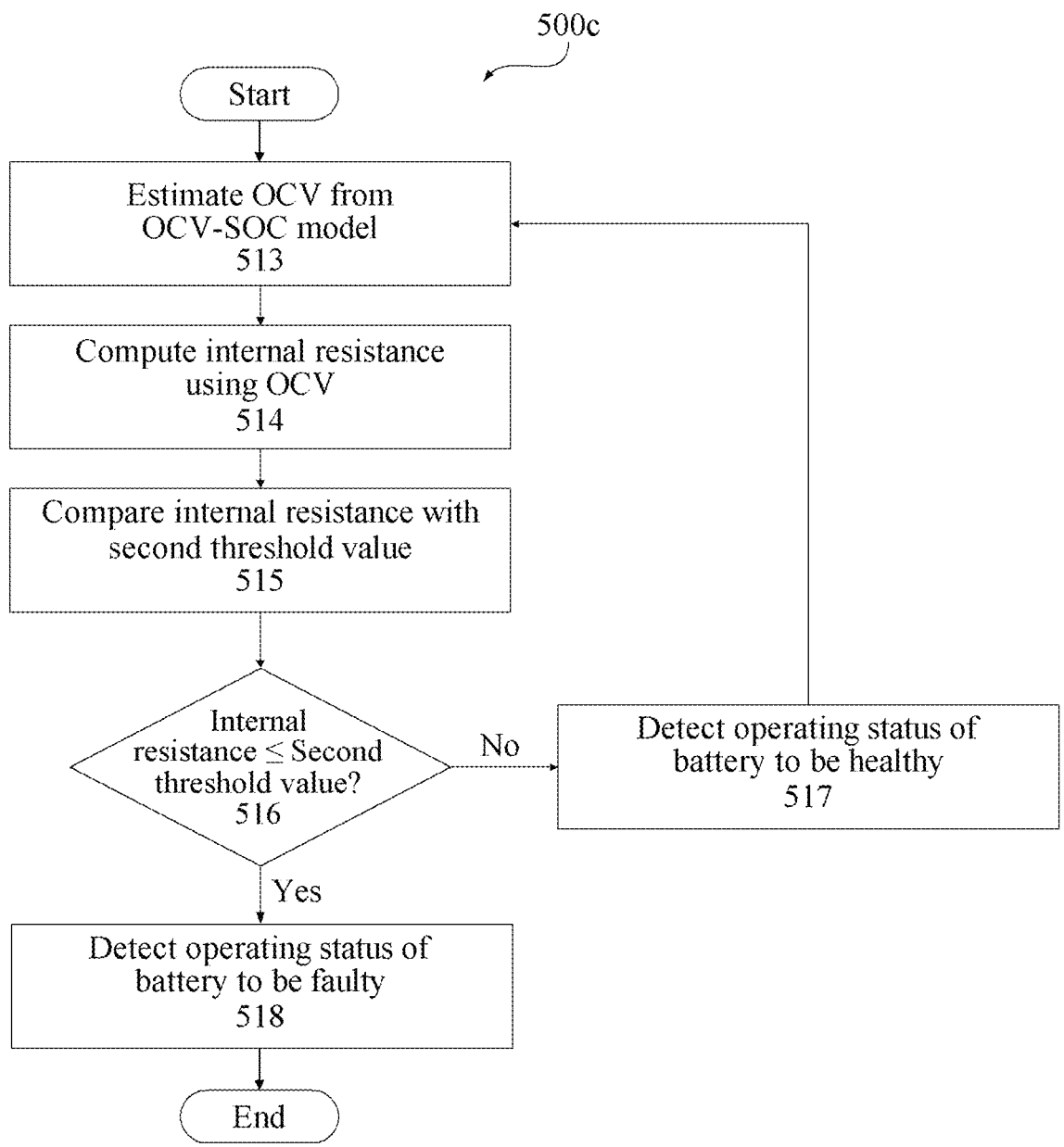
FIG. 5C illustrates an example of a process of detecting an operating status of a battery using an internal resistance.

FIG. 5C illustrates an example of a process of detecting the operating status 216 of the battery 102 using the internal resistance 213. The operations in FIG. 5C may be performed in the sequence and manner as shown, although the order of some operations may be changed or some of the operations omitted without departing from the spirit and scope of the illustrative examples described. Many of the operations shown in FIG. 5C may be performed in parallel or concurrently. One or more blocks of FIG. 5C, and combinations of the blocks, can be implemented by special purpose hardware-based computer, such as a processor, that perform the specified functions, or combinations of special purpose hardware and computer instructions. In addition to the description of FIG. 5C below, the descriptions of FIGS. 1-5B are also applicable to FIG. 5C and are incorporated herein by reference. Thus, the above description may not be repeated here.

Referring to FIG. 5C, the estimation module 203 of the operating status detection apparatus 101 may estimate an OCV from an OCV-SOC model.

The OCV-SOC model may be derived using the constant voltage 210 and the constant current 211.

In operation 514, the estimation module 203 of the operating status detection apparatus 101 may compute the internal resistance 213 using the OCV.

In operation 515, the estimation module 203 of the operating status detection apparatus 101 may compare the internal resistance 213 with the second threshold value 215.

In operation 516, the estimation module 203 of the operating status detection apparatus 101 may verify whether the internal resistance 213 is less than or equal to the second threshold value 215.

In operation 517, when the internal resistance 213 is greater than the second threshold value 215 as a result of operation 516, the estimation module 203 of the operating status detection apparatus 101 may detect the operating status 216 to be healthy. Upon detection of the operating status 216 to be healthy, operations 513 to 517 may be repeated, until the operating status 216 is detected to be faulty.

In operation 518, when the internal resistance 213 is less than or equal to the second threshold value as a result of operation 516, the estimation module 203 of the operating status detection apparatus 101 may detect the operating status 216 to be faulty. Upon detection of the operating status 216 to be faulty, the alert 217 and the notification 218 may be provided for the battery 102.

The methods illustrated in FIGS. 5A, 5B and 5C may include one or more operations for executing processes in the operating status detection apparatus 101. The methods illustrated in FIGS. 5A, 5B and 5C may be described in the general context of computer-executable instructions. Generally, computer-executable instructions may include routines, programs, objects, components, data structures, procedures, modules, and functions, which perform particular functions or implement particular abstract data types. The methods illustrated in FIGS. 5A, 5B and 5C may be implemented in any suitable hardware, software, firmware, or a combination thereof.

Figure 6:
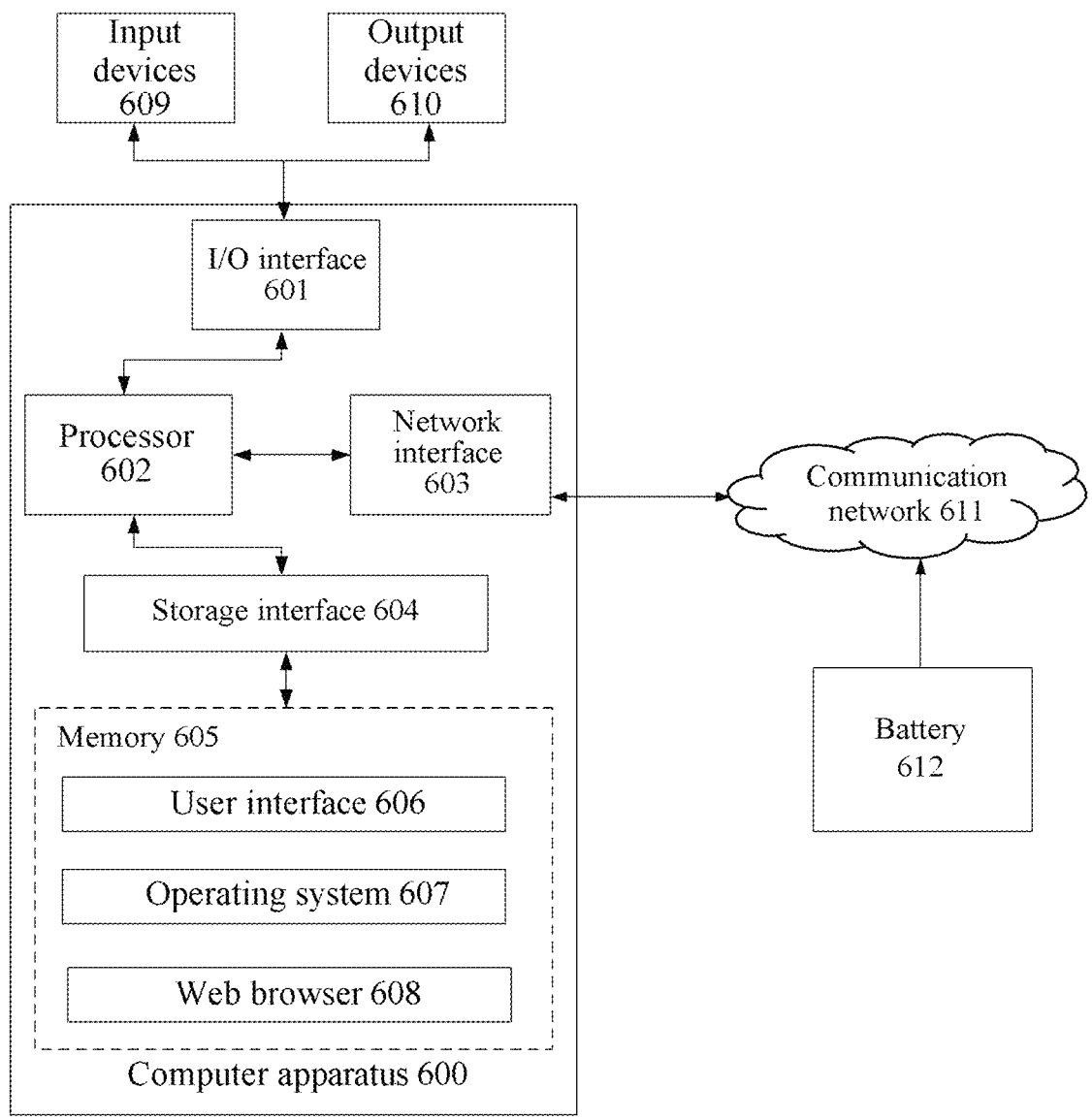
FIG. 6 illustrates an example of a configuration of a computer apparatus for detecting an operating status of a battery.

FIG. 6 illustrates an example of a configuration of a computer apparatus 600 for detecting an operating status of a battery.

Referring to FIG. 6, the computer apparatus 600 is used to implement the operating status detection apparatus 101. The computer apparatus 600 may include a central processing unit ("CPU" or "processor") 602. The processor 602 may include at least one data processor for executing processes in a virtual storage area network. The processor 602 may include specialized processing units such as, integrated system (bus) controllers, memory management control units, floating point units, graphics processing units, or digital signal processing units. Further details regarding the processor 602 is provided below.

The processor 602 may be disposed in communication with one or more input/output (I/O) devices 609 and 610 via an I/O interface 601. The I/O interface 601 may employ communication protocols/methods such as audio, analog, digital, monaural, RCA, stereo, IEEE-1394, serial bus, universal serial bus (USB), infrared, PS/2, BNC, coaxial, component, composite, digital visual interface (DVI), high-definition multimedia interface (HDMI), radio frequency (RF) antennas, S-Video, VGA, IEEE 802.n/b/g/n/x, Bluetooth, and cellular (for example, code-division multiple access (CDMA), high-speed packet access (HSPA+), global system for mobile communications (GSM), long-term evolution (LTE), or WiMax).

Using the I/O interface 601, the computer apparatus 600 may communicate with the one or more I/O devices 609 and 610. For example, the input devices 609 may be an antenna, a keyboard, a mouse, a joystick, an (infrared) remote control, a camera, a card reader, a fax machine, a dongle, a biometric reader, a microphone, a touch screen, a touchpad, a trackball, a stylus, a scanner, a storage device, a transceiver, and a video device/source. The output devices 610 may be a printer, a fax machine, a video display (for example, a cathode ray tube (CRT), a liquid crystal display (LCD), a light-emitting diode (LED), a plasma, a plasma display panel (PDP), or an organic light-emitting diode display (OLED)), an audio speaker, a vibration, or a haptic feedback generator.

In some examples, the computer apparatus 600 may include the operating status detection apparatus 101. The processor 602 may be disposed in communication with a communication network 611 via a network interface 603. The network interface 603 may communicate with the communication network 611. The network interface 603 may employ connection protocols including direct connect, Ethernet (for example, twisted pair 10/100/1000 Base T), Transmission Control Protocol/Internet Protocol (TCP/IP), Token Ring, and IEEE 802.11a/b/g/n/x. The communication network 611 may include a direct interconnection, a local area network (LAN), a wide area network (WAN), a wireless network (for example, using Wireless Application Protocol), or the Internet. Using the network interface 603 and the communication network 611, the computer apparatus 600 may communicate with a battery 612, for detecting the operating status of the battery 612.

The communication network 611 includes, but is not limited to, a direct interconnection, an e-commerce network, a peer-to-peer (P2P) network, a local area network (LAN), a wide area network (WAN), a wireless network (for example, using Wireless Application Protocol), the Internet, or Wi-Fi. The first network and the second network may either be a dedicated network or a shared network, which represents an association of the different types of networks that use a variety of protocols. For example, Hypertext Transfer Protocol (HTTP), Transmission Control Protocol/Internet Protocol (TCP/IP), or Wireless Application Protocol (WAP) is used to communicate with each other. Further, the first network and the second network may include a variety of network devices, including routers, bridges, servers, computing devices, and storage devices.

In an example, the processor 602 may communicate with a memory 605 (for example, RAM or ROM not shown in FIG. 6) via a storage interface 604. The storage interface 604 may connect to the memory 605 including memory drives and removable disc drives, employing connection protocols such as, serial advanced technology attachment (SATA), integrated drive electronics (IDE), IEEE-1394, universal serial bus (USB), Fiber Channel, and Small Computer System Interface (SCSI). The memory drives may further include a drum, a magnetic disc drive, a magneto-optical drive, an optical drive, a redundant array of independent discs (RAIDs), solid-state memory devices, and solid-state drives.

The operating system 607 may facilitate resource management and operation of the computer apparatus 600. Examples of operating systems include APPLE MACINTOSH® OS X, UNIX®, UNIX-like system distributions (for example, BERKELEY SOFTWARE DISTRIBUTION™ (BSD), FREEBSD™, NETBSD™, or OPENBSD™), LINUX DISTRIBUTIONS' (for example, RED HAT™, UBUNTU™, or KUBUNTU™), IBM™ OS/2, MICROSOFT™ WINDOWS™ (XP™, VISTA™/7/ 8, or 10), APPLE® IOS™, GOOGLE® ANDROID™, or BLACKBERRY® OS.

In some examples, the computer apparatus 600 may implement a web browser 608 stored program component. The web browser 608 may be a hypertext viewing application, such as Microsoft Internet Explorer, Google Chrome, Mozilla Firefox, or Apple Safari. Secure web browsing may be provided using Hypertext Transport Protocol Secure (HTTPS), Secure Sockets Layer (SSL), and Transport Layer Security (TLS). The web browser 608 may utilize facilities such as AJAX, DHTML, Adobe Flash, JavaScript, Java, and Application Programming Interfaces (APIs). In some examples, the computer apparatus 600 may implement a mail server stored program component. The mail server may be an Internet mail server such as Microsoft Exchange. The mail server may utilize facilities such as ASP, ActiveX, ANSI C++/C #, Microsoft .NET, Common Gateway Interface (CGI) scripts, Java, JavaScript, PERL, PHP, Python, and WebObjects. The mail server may utilize communication protocols such as Internet Message Access Protocol (IMAP), Messaging Application Programming Interface (MAPI), Microsoft Exchange, Post Office Protocol (POP), or Simple Mail Transfer Protocol (SMTP). In some examples, the computer apparatus 600 may implement a mail client stored program component. The mail client may be a mail viewing application, such as Apple Mail, Microsoft Entourage, Microsoft Outlook, or Mozilla Thunderbird.

The operating status detection apparatus 101, charging profile computation module 201, voltage and current identification module 202, estimation module 203, comparison module 204, operating status detection module 205, alerting module 206, notification module 207, other modules 208, and other apparatuses, units, modules, devices, and other components described herein are implemented by hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, multiple-instruction multiple-data (MIMD) multiprocessing, a controller and an arithmetic logic unit (ALU), a DSP, a microcomputer, a field-programmable gate array (FPGA), an application-specific integrated circuit (ASIC), a programmable logic unit (PLU), a central processing unit (CPU), a graphics processing unit (GPU), a neural processing unit (NPU), a tensor processing unit (TPU), or any other device capable of responding to and executing instructions in a defined manner.

The methods that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control a processor or computer to implement the hardware components and perform the methods as described above are written as computer programs, code segments, instructions, or any combination thereof, for individually or collectively instructing or configuring the processor or computer to operate as a machine or special-purpose computer to perform the operations performed by the hardware components and the methods as described above. In one example, the instructions or software include machine code that is directly executed by the processor or computer, such as machine code produced by a compiler. In an example, the instructions or software includes at least one of an applet, a dynamic link library (DLL), middleware, firmware, a device driver, an application program storing the method of detecting an operating status of a battery in a battery system. In another example, the instructions or software include higher-level code that is executed by the processor or computer using an interpreter. Programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control a processor or computer to implement the hardware components and perform the methods as described above, and any associated data, data files, and data structures, are recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and providing the instructions or software and any associated data, data files, and data structures to a processor or computer so that the processor or computer can execute the instructions.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method of detecting an operating status of a battery in a battery system, the method comprising:
    determining a charging profile of a battery in a battery system;
    identifying a constant voltage and a corresponding constant current in a charging cycle of the charging profile;
    estimating a decay constant and an internal resistance associated with the battery, using at least one of the constant voltage or the constant current;
    comparing the decay constant with a first threshold value and comparing the internal resistance with a second threshold value; and
    detecting an operating status of the battery to be faulty or healthy, based on the comparison.

2. The method of claim 1, wherein the charging profile is determined irrespective of a discharge state of the battery.

3. The method of claim 1, wherein the detecting comprises detecting the operating status of the battery to be faulty in response to the decay constant being less than or equal to the first threshold value,
    wherein the first threshold value comprises a minimum value of the decay constant for triggering an internal short in the battery.

4. The method of claim 1, wherein the detecting comprises detecting the operating status of the battery to be faulty in response to the internal resistance being less than or equal to the second threshold value,
    wherein the second threshold value comprises a minimum value of the internal resistance for triggering an internal short in the battery.

5. The method of claim 1, further comprising:
    providing an alert regarding the faulty operating status of the battery, prior to an internal short occurring in the battery.

6. The method of claim 1, wherein the detecting comprises detecting the operating status of the battery to be healthy, in response to the decay constant being greater than the first threshold value and the internal resistance being greater than the second threshold value.

7. The method of claim 1, wherein the detecting comprises detecting the operating status of the battery to be healthy, in response to the decay constant being greater than the first threshold value.

8. The method of claim 1, wherein the detecting comprises detecting the operating status of the battery to be healthy, in response to the internal resistance being greater than the second threshold value.

9. The method of claim 1, wherein the decay constant for the charging cycle is estimated by applying an exponential decay model to the constant current in the charging cycle.

10. The method of claim 1, wherein the internal resistance of the battery is estimated using the constant voltage, the constant current, and open circuit voltage determined using an open circuit voltage (OCV)-state of charge (SOC) model of the battery.

11. The method of claim 1, wherein a value of the internal resistance indicates sensitivity of fault in the battery.

12. The method of claim 1, further comprising:
    generating a notification comprising one or more remedies to avoid an internal short in the battery, upon detection of the operating status of the battery to be faulty.

13. An apparatus for detecting an operating status of a battery in a battery system, the apparatus comprising:
    a processor configured to:
        determine a charging profile of a battery in a battery system,
        identify a constant voltage and a corresponding constant current in a charging cycle of the charging profile,
        estimate a decay constant and an internal resistance associated with the battery, using at least one of the constant voltage or the constant current,
        compare the decay constant with a first threshold value and compare the internal resistance with a second threshold value, and
        detect an operating status of the battery to be faulty or healthy, based on the comparison.

14. The operating status detection apparatus of claim 13, wherein the charging profile is determined irrespective of a discharge state of the battery.

15. The operating status detection apparatus of claim 13, wherein the processor is further configured to detect the operating status of the battery to be faulty in response to the decay constant being less than or equal to the first threshold value,
    wherein the first threshold value comprises a minimum value of the decay constant for triggering an internal short in the battery.

16. The operating status detection apparatus of claim 13, wherein the processor is further configured to detect the operating status of the battery to be faulty in response to the internal resistance being less than or equal to the second threshold value,
    wherein the second threshold value comprises a minimum value of the internal resistance for triggering an internal short in the battery.

17. The operating status detection apparatus of claim 13, wherein the processor is further configured to detect the operating status of the battery to be healthy in response to the decay constant being greater than the first threshold value and the internal resistance being greater than the second threshold value.

18. The operating status detection apparatus of claim 13, wherein the decay constant for the charging cycle is estimated by applying an exponential decay model to the constant current in the charging cycle.

19. The operating status detection apparatus of claim 13, wherein the internal resistance of the battery is estimated using the constant voltage, the constant current, and open circuit voltage determined using an open circuit voltage (OCV)-state of charge (SOC) model of the battery.

20. The operating status detection apparatus of claim 13, wherein a value of the internal resistance indicates sensitivity of fault in the battery.

* * * * *